(12) United States Patent
Jain et al.

(10) Patent No.: US 9,645,715 B1
(45) Date of Patent: May 9, 2017

(54) SYSTEM, METHOD, AND COMPUTER PROGRAM PRODUCT FOR ELECTRONIC DESIGN VISUALIZATION

(71) Applicant: Cadence Design Systems, Inc., San Jose, CA (US)

(72) Inventors: Abha Jain, Noida (IN); Hitesh Mohan Kumar, Greater Noida (IN); Parag Choudhary, Toronto (CA); Viren Agarwal, Kalimpong (IN)

(73) Assignee: Cadence Design Systems, Inc., San Jose, CA (US)

( * ) Notice: Subject to any disclaimer, the term of this patent is extended or adjusted under 35 U.S.C. 154(b) by 169 days.

(21) Appl. No.: 14/152,197

(22) Filed: Jan. 10, 2014

(51) Int. Cl.
*G06F 3/048* (2013.01)
*G06F 3/0484* (2013.01)

(52) U.S. Cl.
CPC ................................. *G06F 3/0484* (2013.01)

(58) Field of Classification Search
None
See application file for complete search history.

(56) References Cited

U.S. PATENT DOCUMENTS 6,721,922 B1 * 4/2004 Walters et al. ............... 716/102

OTHER PUBLICATIONS

Davies, John, Introduction to OrCAD Capture and PSPICE, Sep. 18, 2008, http://userweb.eng.gla.ac.uk/john.davies/orcad/spiceintro160.pdf.*
Intusoft, IsSpice4 User's Guide, 2007, intusoft, vols. 1 and 2, http://www.intusoft.com/lit/IsSpice4.pdf.*

* cited by examiner

*Primary Examiner* — William Trapanese
(74) *Attorney, Agent, or Firm* — Mark H. Whittenberger, Esq.; Holland & Knight LLP (57) ABSTRACT

The present disclosure relates to a computer-implemented method for electronic design simulation. The method may include receiving, using at least one processor, an electronic design and displaying, at a graphical user interface, at least a portion of the electronic design. Embodiments may also include allowing a user to select at least one design variable at the graphical user interface. Embodiments may also include simulating the electronic design, based upon, at least in part, the selected at least one design variable and in response to the simulation, automatically displaying an updated value at the graphical user interface.

14 Claims, 12 Drawing Sheets

SYSTEM, METHOD, AND COMPUTER PROGRAM PRODUCT FOR ELECTRONIC DESIGN VISUALIZATION

FIELD OF THE INVENTION

The present disclosure relates to electronic designs, and more specifically, to a method for electronic design visualization.

DISCUSSION OF THE RELATED ART

In the world of electronic design automation ("EDA"), electronic designers simulate designs and may visualize the output waveforms in a graphical probe display. However, they cannot correlate the schematic nets with the probe waveforms. While waveforms may provide excellent information on multiple values—they are not intuitive to debug a circuit at a particular point as schematic context is required for it. As such, these systems do not provide the user with any automated way to debug the design in-situ. The user cannot search for relevant simulation states on the schematic itself. For example, while using schematic probes to cross-probe with a waveform viewer, the designer may need to move their eyes back and forth between the schematic and waveforms continuously. Often, the designers need to view a particular simulation state (as well as in states in immediately before or after a particular state), rather than continuously varying simulation data. Additionally, instead of data at all simulation points, the designer needs to view data across all schematic nodes to locate the problem, which is cumbersome and unintuitive to do with a waveform viewer. It leads to too much data display, which may hide the real points of interest from the user.

Summary of Disclosure

In one or more embodiments of the present disclosure, a computer-implemented method for electronic design simulation is provided. The method may include receiving, using at least one processor, an electronic design and displaying, at a graphical user interface, at least a portion of the electronic design. Embodiments may also include allowing a user to select at least one design variable at the graphical user interface. Embodiments may also include simulating the electronic design, based upon, at least in part, the selected at least one design variable and in response to the simulation, automatically displaying an updated value at the graphical user interface.

One or more of the following features may be included. In some embodiments, the at least one design variable includes a sweeping variable configured to generate continuously-varying simulation data. The sweeping variable may include at least one of time, frequency, resistance, temperature, and tolerance. The method may further include providing at least one slider at the graphical user interface, the at least one slider configured to allow the user to select the at least one design variable. The method may also include automatically annotating at least one device state associated with the electronic design at the graphical user interface. In some embodiments, automatically annotating at least one device state may include one or more of a bias status of a diode, a saturation status of a transistor, and a device specific parameter value. The updated value may include at least one of a node voltage, a current through a pin, an amount of power consumption by a device, a change in current through a pin, a change in voltage across a net, an impedance across two terminals, a single variable expression, a differential variable expression, and a complex expression having two or more variables.

In one or more embodiments of the present disclosure a computer-readable storage medium having stored thereon instructions, which when executed by a processor result in one or more operations for electronic design simulation. Operations may include receiving, using at least one processor, an electronic design and displaying, at a graphical user interface, at least a portion of the electronic design. Operations may also include allowing a user to select at least one design variable at the graphical user interface. Operations may also include simulating the electronic design, based upon, at least in part, the selected at least one design variable and in response to the simulation, automatically displaying an updated value at the graphical user interface.

One or more of the following features may be included. In some embodiments, the at least one design variable includes a sweeping variable configured to generate continuously-varying simulation data. The sweeping variable may include at least one of time, frequency, resistance, temperature, and tolerance. Operations may further include providing at least one slider at the graphical user interface, the at least one slider configured to allow the user to select the at least one design variable. Operations may also include automatically annotating at least one device state associated with the electronic design at the graphical user interface. In some embodiments, automatically annotating at least one device state may include one or more of a bias status of a diode, a saturation status of a transistor, and a device specific parameter value. The updated value may include at least one of a node voltage, a current through a pin, an amount of power consumption by a device, a change in current through a pin, a change in voltage across a net, an impedance across two terminals, a single variable expression, a differential variable expression, and a complex expression having two or more variables.

In one or more embodiments of the present disclosure, a system for electronic design simulation is provided. The system may include one or more processors configured to receive an electronic design and display, at a graphical user interface, at least a portion of the electronic design, the one or more processors further configured to allow a user to select at least one design variable at the graphical user interface, the one or more processors further configured to simulate the electronic design, based upon, at least in part, the selected at least one design variable and in response to the simulation, the one or more processors configured to automatically display an updated value at the graphical user interface.

One or more of the following features may be included. In some embodiments, the at least one design variable may include a sweeping variable configured to generate continuously-varying simulation data. The sweeping variable may include at least one of time, frequency, resistance, temperature, and tolerance. The one or more processors may be configured to provide at least one slider at the graphical user interface, the at least one slider configured to allow the user to select the at least one design variable. The one or more processors may be configured to automatically annotate at least one device state associated with the electronic design at the graphical user interface. In some embodiments, automatically annotating at least one device state may include one or more of a bias status of a diode, a saturation status of a transistor, and a device specific parameter value.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Figure 1:
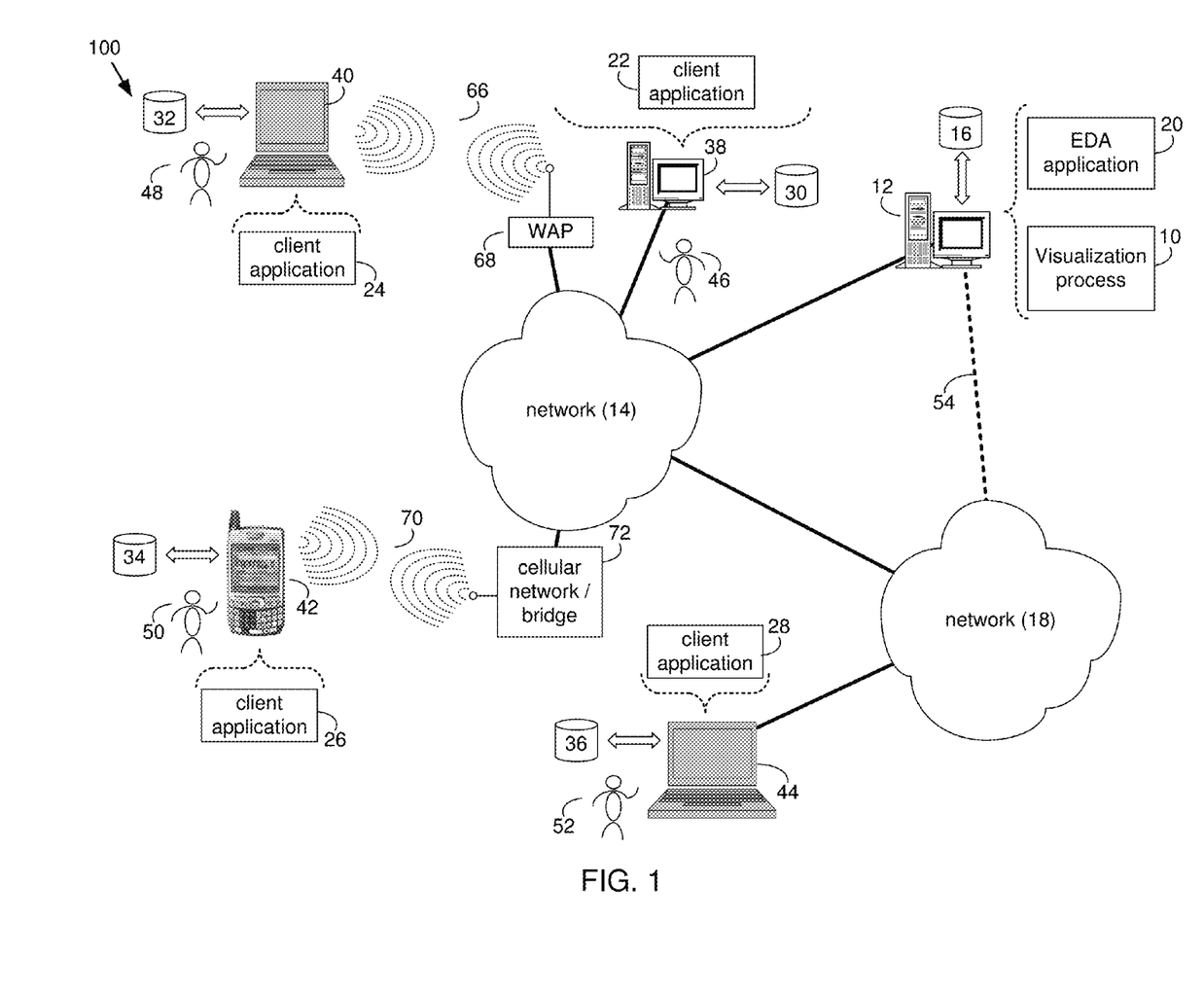
FIG. 1 is a diagram depicting an embodiment of a system in accordance with the present disclosure.

Referring to FIG. 1, there is shown a visualization process 10 that may reside on and may be executed by server computer 12, which may be connected to network 14 (e.g., the Internet or a local area network, etc.). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, visualization process 10 may reside on and be executed, in whole or in part, by a client electronic device, such as a personal computer, notebook computer, personal digital assistant, or the like.

The instruction sets and subroutines of visualization process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain, for example, port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Visualization process 10 may be a stand alone application, or may be an applet/application/script that may interact with and/or be executed within EDA application 20. In addition/as an alternative to being a server-side process, visualization process 10 may be a client-side process (not shown) that may reside on a client electronic device (described below) and may interact with an EDA client application (e.g., one or more of EDA client applications 22, 24, 26, 28). Further, visualization process 10 may be a hybrid server-side/client-side process that may interact with EDA application 20 and an EDA client application (e.g., one or more of client applications 22, 24, 26, 28). As such, visualization process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize visualization process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

The term "design" as used herein may refer to, but is not limited to, an integrated circuit design, or any other suitable type of electronic design, such as those associated with electronic design automation tools. Numerous designs may be simulated and various graphical user interfaces may be used to visualize the design without departing from the scope of the present disclosure.

Figure 2:
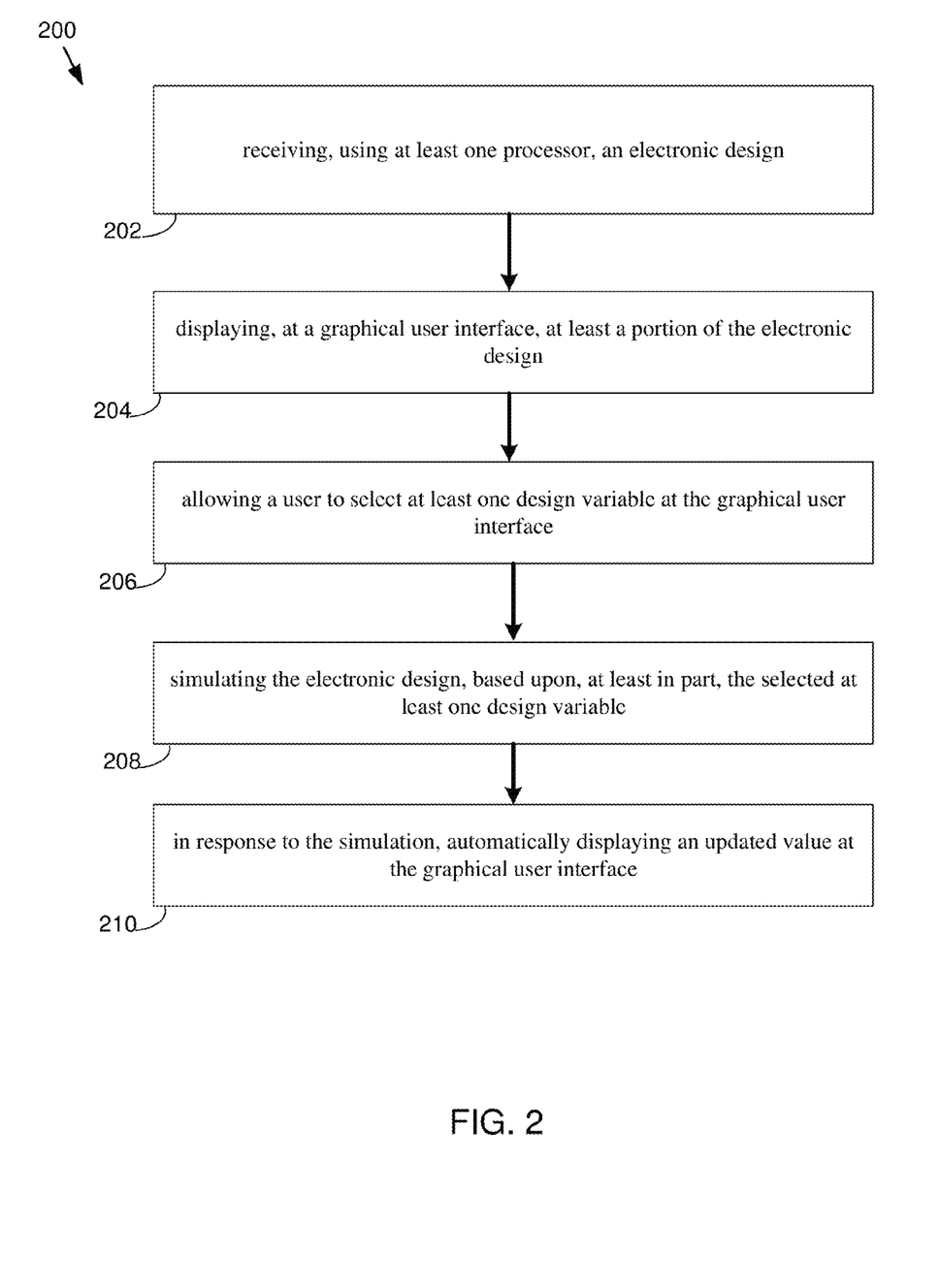
FIG. 2 is a flowchart depicting operations consistent with the visualization process in accordance with an embodiment of the present disclosure.

Referring now to FIG. 2, a flowchart 200 depicting operations consistent with an embodiment of visualization process 10 is provided. Visualization process 10 may include receiving (202), using at least one processor, an electronic design and displaying (204), at a graphical user interface, at least a portion of the electronic design. Process 10 may further include allowing (206) a user to select at least one design variable at the graphical user interface. Process 10 may also include simulating (208) the electronic design, based upon, at least in part, the selected at least one design variable and in response to the simulation, automatically displaying (210) an updated value at the graphical user interface.

As used herein, the phrase "simulation state" may refer to the circuit state for a particular input parameter value. Some simulation states may include, but are not limited to, voltages on signals, currents across device pins, power consumed by devices, complex expressions using one or more of the above data values, input and output impedances in the circuit, and/or any other user provided input or simulation computed value. The simulation state may be computed for one or more of the following parameters, time, frequency, temperature, DC voltage, AC voltage, any simulation model parameter e.g. resistor value, any simulation setup value, etc. Some examples of simulation states may include, for example, all voltage values in a schematic block at a particular time (e.g. Time=5 seconds), all current values in a schematic block for a particular temperature and/or temperature and time (e.g., Temperature=373K and Time=1 second), all device power consumption values in a schematic block for a particular frequency (e.g. Frequency=50 Hz), etc.

As used herein, the phrase "sweeping variable" may refer to a design variable whose value may be swept to generate continuously-varying simulation data. Some examples of sweeping variables may include, but are not limited to, time, frequency, resistance value, temperature and tolerance. The data may include continuously varying simulation data and/or discrete data. Mixed signal designs, for example, have both continuously varying data as well as discrete data varying with time Referring now to FIGS. 3-4, in some systems, a graphical probe window may be used to display variable simulation data in a waveform display window (i.e. a probe). They may be cross-probed with a schematic using schematic markers. The designer may click on a net or a pin in the schematic, and its corresponding voltage/current value may be displayed in the probe. Similarly, the designer may create complex expressions in probe, and view their computed values. However, there is no way to see this variable simulation data values for the entire schematic in one operation. If the user needs to view a particular simulation state, e.g., at a particular time, the designer may add waveforms for all time points and zoom-in to the required region. Then, the designer may use a cursor to view the values of all probes in a tabular view, which is nearly unreadable. However, this may lead to too many waveforms in probe. Moreover, multiple user interface operations may be required in order to view all of the relevant signals at or around a particular state.

Figure 3:
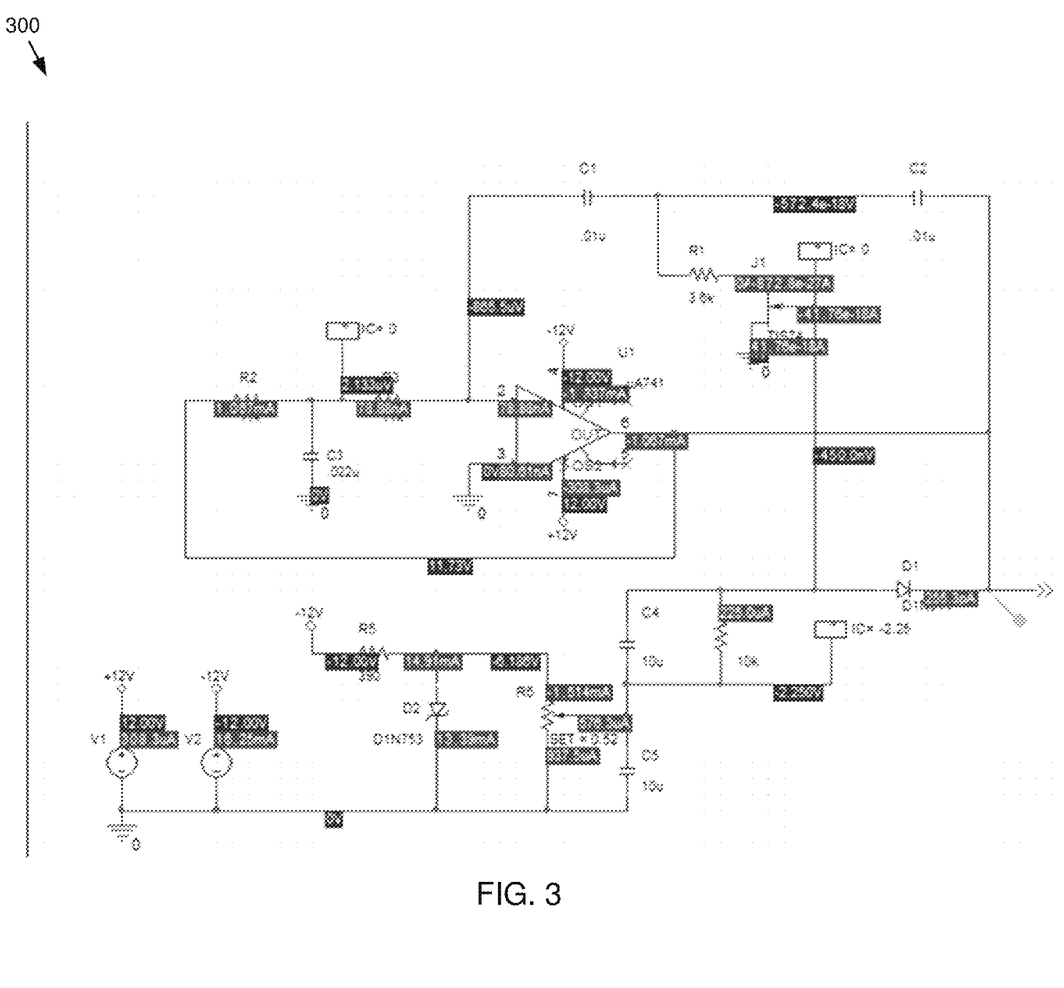
FIG. 3 is a diagram depicting an embodiment in accordance with the present disclosure.
Figure 4:
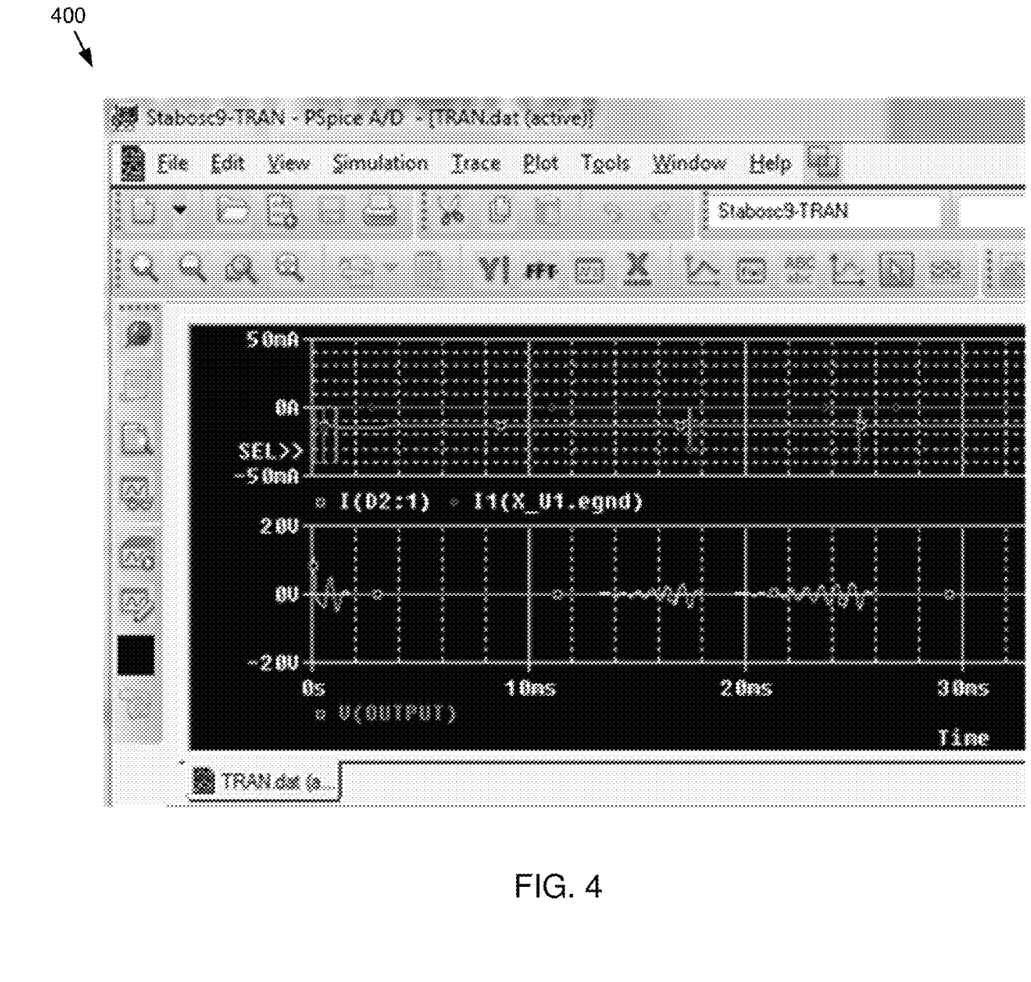
FIG. 4 is a diagram depicting an embodiment in accordance with the present disclosure.

In some instances, the designer may annotate a bias point value to the schematic. This helps in visualizing schematic operation at bias point. However, and as shown in FIG. 3, a bias point is the initial operating point of the system, and is a very small subset of the total amount of data that may be generated during simulation. Similarly, and as shown in FIG. 4, only values at TIME=0 are shown on the schematic. The circuit has intuitive meaning for an analog designer but he/she has to switch back and forth between the schematic and plots to see the values at a particular time. The plot may not be used to see a large number of traces as that creates usability issues.

Accordingly, visualization process 10 may be configured to process the simulation data and any user-specified simulation state may be annotated on the schematic. In addition to the static data such as in the bias point example provided above, this may include user-selectable variable data varying with design variables.

In some embodiments, the schematic may be configured to show any simulation state depending on the design variable value input by the user. In this way, the designer may be able to specify the values of the sweeping variables, for which the corresponding simulation state is to be annotated, using a number of techniques. Some of these may include, but are not limited to, the schematic editor displaying one or more sliders, which may be used to specify the values of the sweeping variables, the value of the sweeping variables may also be set in the waveform viewer using a context-sensitive menu.

In some embodiments, specifying the states may be intuitive, and require minimum user inputs. A slider window, or a similar intuitive control, may be provided for parameter selections, which enables the designer to switch among different states with a single click. For transient analysis, the slider may support sweeping time in a number of ways, including, but not limited to, linear sweep over time, linear sweep over simulation time-points, etc. The interface may include any other form of graphical user interface that allows selection of a point on multiple points (similar to the slider example discussed herein).

Figure 6A:
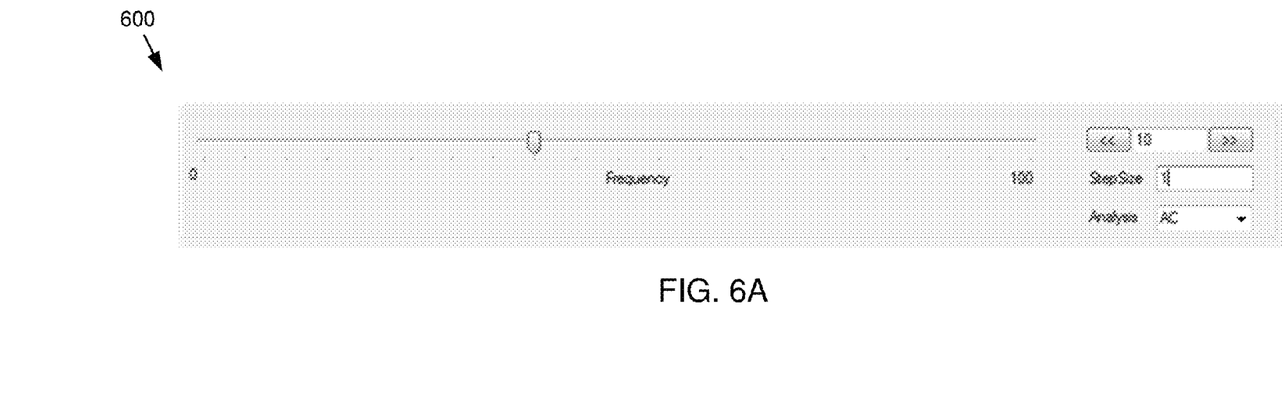
FIG. 6A is a diagram depicting an embodiment in accordance with the present disclosure.
Figure 6B:
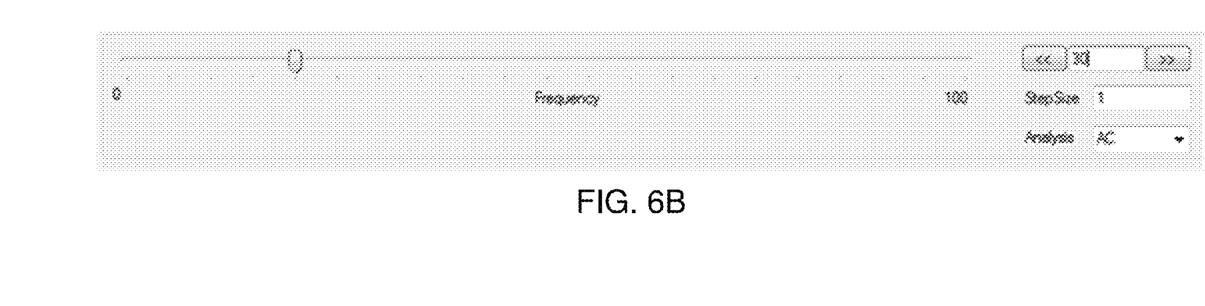
FIG. 6B is a diagram depicting an embodiment in accordance with the present disclosure.
Figure 6C:
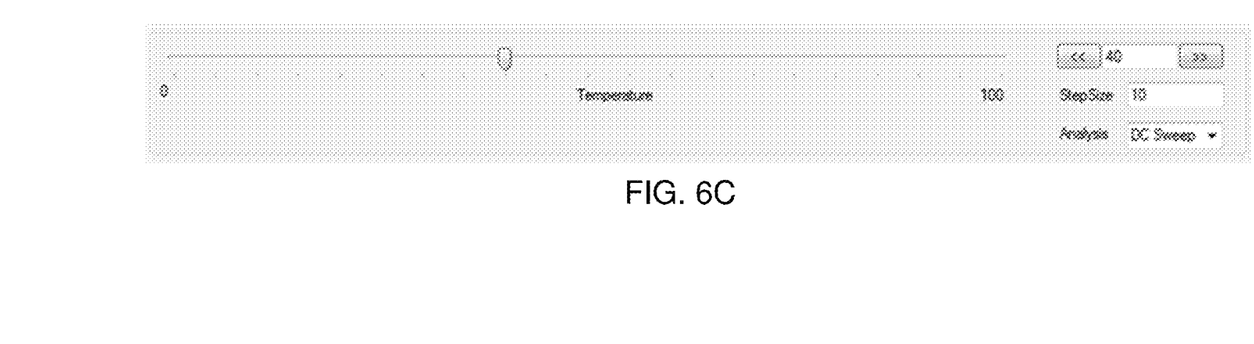
FIG. 6C is a diagram depicting an embodiment in accordance with the present disclosure.

In some embodiments, simulation states displayed from nested parametric sweeps may be supported using multiple slider windows such as those shown in FIGS. 6A-6C. Accordingly, the designer may not be required to create any visualization objects on the schematic, in contrast, visualization process 10 may display the annotations for the complete schematic automatically at all times. The designer may also have the flexibility to reduce annotated data by using visualization process 10 in order to filter on voltage, current and power.

In some embodiments, visualization process 10 may provide a number of customizable debugging aids, which may be available to the designer to search for and show a logical simulation state. For example, instead of the designer specifying the value of the parameter, the designer may provide a set of conditions (e.g. instead of requesting "Time=1 s", the designer may request "the circuit state at the next maxima of output voltage").

In some embodiments, visualization process 10 may support annotation of device states as visual clues. Accordingly, the following annotations may be supported: forward/reverse bias status of a diode, forward-active/saturation status of a BJT, device-specific parameter values (e.g., beta of BJT), etc. This data may be computed automatically, and may be annotated based on the user's design choice.

Figure 5:
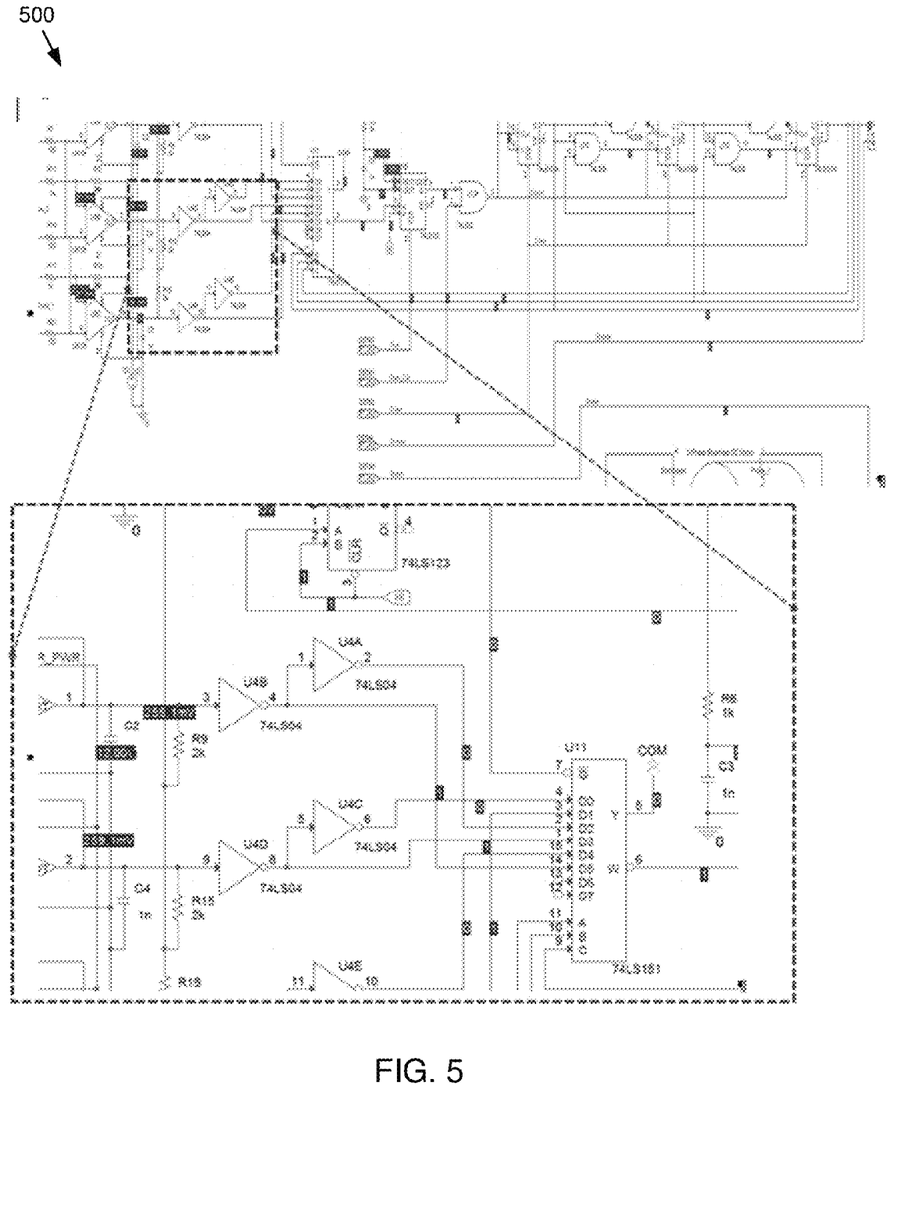
FIG. 5 is a diagram depicting an embodiment in accordance with the present disclosure.

Referring now to FIG. 5, an embodiment 500 of visualization process 10 depicting an example where the schematic is dynamically annotated with voltage values for different time-points is provided. In this way, simulation information may be annotated on the entire schematic for multiple values of the X-Axis as well as for other sweep variables such as temperature, etc. This may allow the designer to view the entire simulation data without using plots.

Referring now to FIGS. 6A-6C, embodiments showing various slider windows are shown. FIG. 6A depicts the selection of frequency points on a slider window. The arrow buttons may be used for backward and forward movement of time with the step-size defined on the slider. The analysis button may be used to select a particular section of the probe data file. FIG. 6B shows the selection of a different frequency point on the slider window. Depending on the frequency value, a different simulation state is shown on the schematic window.

Figure 7:
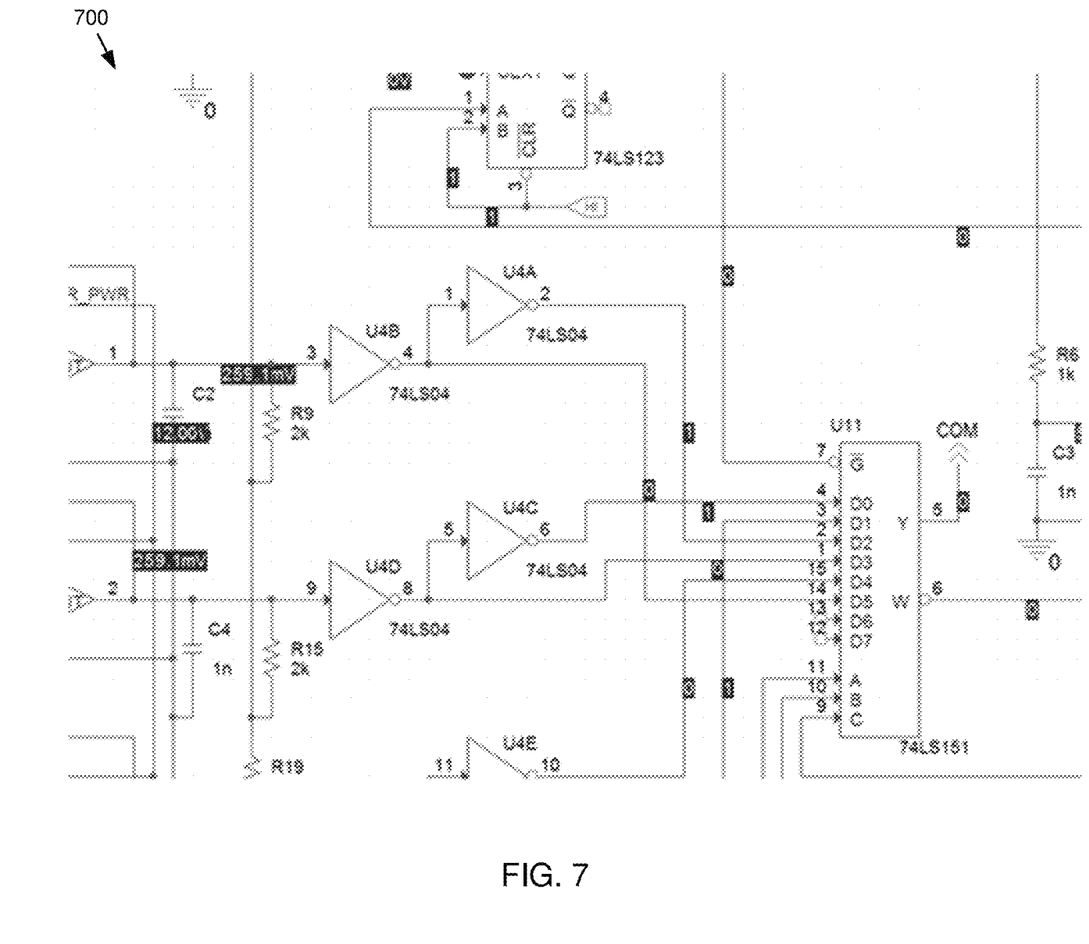
FIG. 7 is a diagram depicting an embodiment in accordance with the present disclosure.

Referring also to FIG. 7, an embodiment showing the updated annotation on the schematic based upon the newly received user-input is provided. It can be seen in the picture that the data on a number of nets has changed, in response to the new user input. FIG. 6C shows selection of Temperature value on the slider window. The data has been generated from a DC sweep analysis over temperature.

Figure 8:
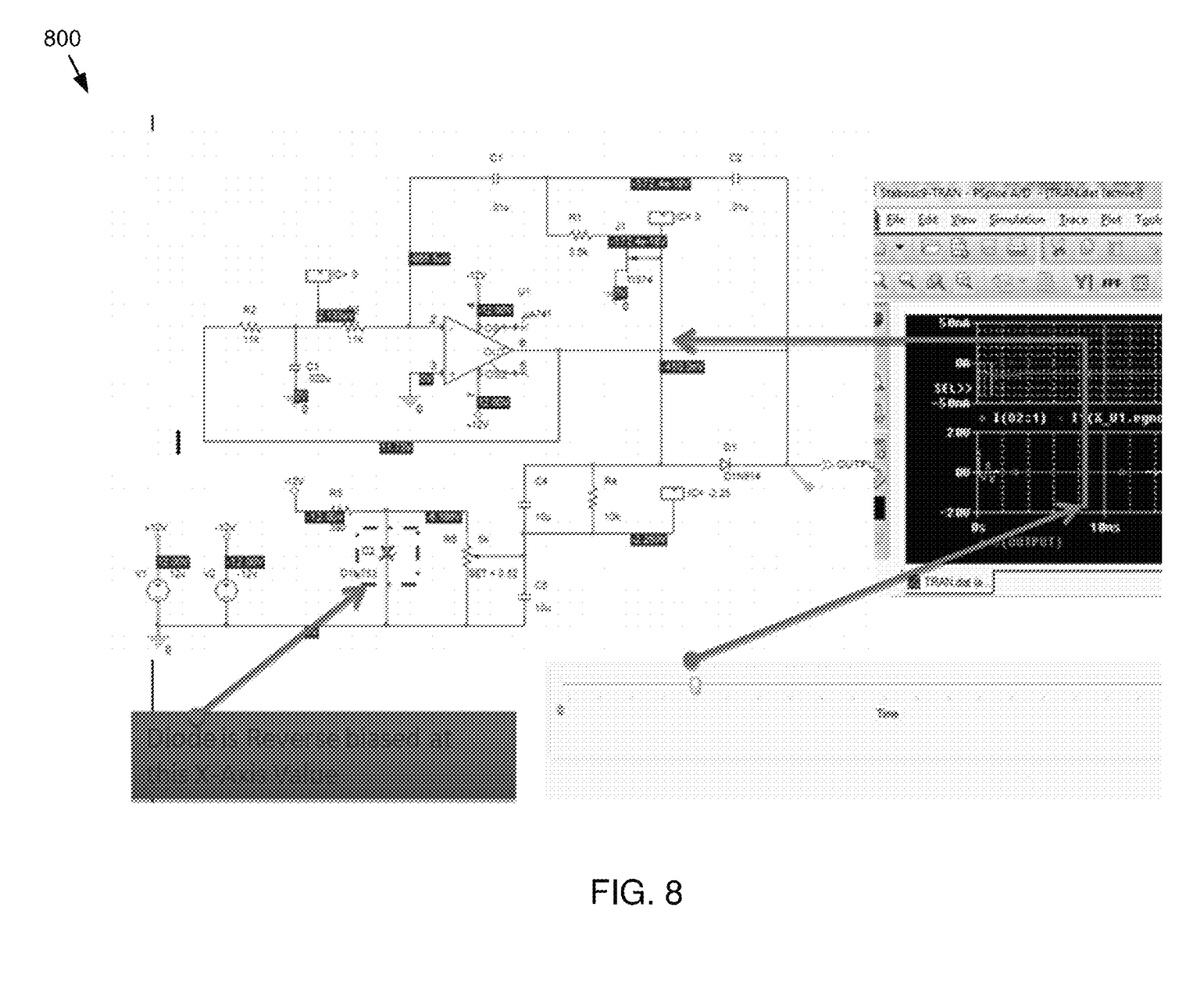
FIG. 8 is a diagram depicting an embodiment in accordance with the present disclosure.

Referring also to FIG. 8, an embodiment of visualization process 10 showing contextual device information is provided. In this particular example, the diode is shown as being reverse biased, being marked with an "X" showing contextual device information on the schematic.

In some embodiments, visualization process 10 may be configured to display various data types. Some of these may include, but are not limited to, simulation-generated data, voltage for any node, current through any pin, power consumption of any device, di/dt through a pin, dv/dt across a net, impedance/trans-conductance across 2 terminals, expressions using single variables, e.g. Vrms(Node1), Vcumulative avg(Node1), differential variable expression (e.g. (V1-V2) rms), complex expressions using two or more variables. One category may be differential variables (e.g. (V1-V2)rms). These may be displayed in Table view or using any suitable format. In some instances, the minimum/maximum/average for a range of values chosen on the slider may also be displayed. The values may be updated for all the design elements of the entire circuit diagram being shown to the user.

In some embodiments, user input may be captured on the schematic or in the waveform window using Right Mouse Button. FIGS. 6A-6C show using a slider to select the parameter value for which the schematic needs to be annotated. Multiple sliders may be used to show data for two or more selected parameter values simultaneously. In some cases these may be displayed with different color codes for better visibility. Single or multiple data elements per selection may be shown depending on the designer's selection. For example, multiple values may be annotated for a single object in the following cases: Vrms(t), as well as V(t) and the worst cases for each parameter (e.g. min and max of each voltage value). These may be color coded (e.g. Blue for min and Red for max, etc.).

In some embodiments, for frequency-domain data, the designer may specify whether one or more of magnitude/phase/real/imaginary components of the complex data are to be displayed. For scenarios with multiple dimensions the designer may select the values to be shown on the schematic using various mechanisms, some of which may include, but are not limited to, a multi-dimensional graph, multiple sliders, and/or sub-selection using GUI wizards.

In some embodiments, visualization process 10 may be configured to display data using any user specified units. For example, data units may be SI units depending on displayed value. Therefore, volts may be used for voltage, amperes for current, and watts for power, etc. All standard multipliers such as Tera(T), Giga(G), Mega(Meg), Kilo(k), milli(m), micro(u), nano(n), femto(f) and atto(a) may also be used to display the data values in the most readable manner. The data values may be automatically converted to the nearest multiplier among this list for the best possible readability.

In some embodiments, the data source for showing this data is the simulation output data. This data can be input using a variety of techniques. Some of which may include, but are not limited to, offline from the simulation output file after the simulation is complete, runtime data from simulation while the simulation is running, etc. The data may be generated from any simulation run. Examples may include time-domain transient simulation (e.g., data can be displayed for any Time value), frequency-domain ac simulation (e.g., data can be displayed for any frequency value), parametric sweep (e.g. data can be displayed for any parameter value, slider shows value of swept parameter, multiple sliders can be used to see values for 2-level parametric sweeps), DC sweep (e.g., slider shows value of DC source), temperature-dependent transient analysis (e.g. multiple Sliders to select temperature and time), data from Monte-Carlo analysis (e.g. an extra slider to choose section to be used for displaying values), etc.

Figure 9:
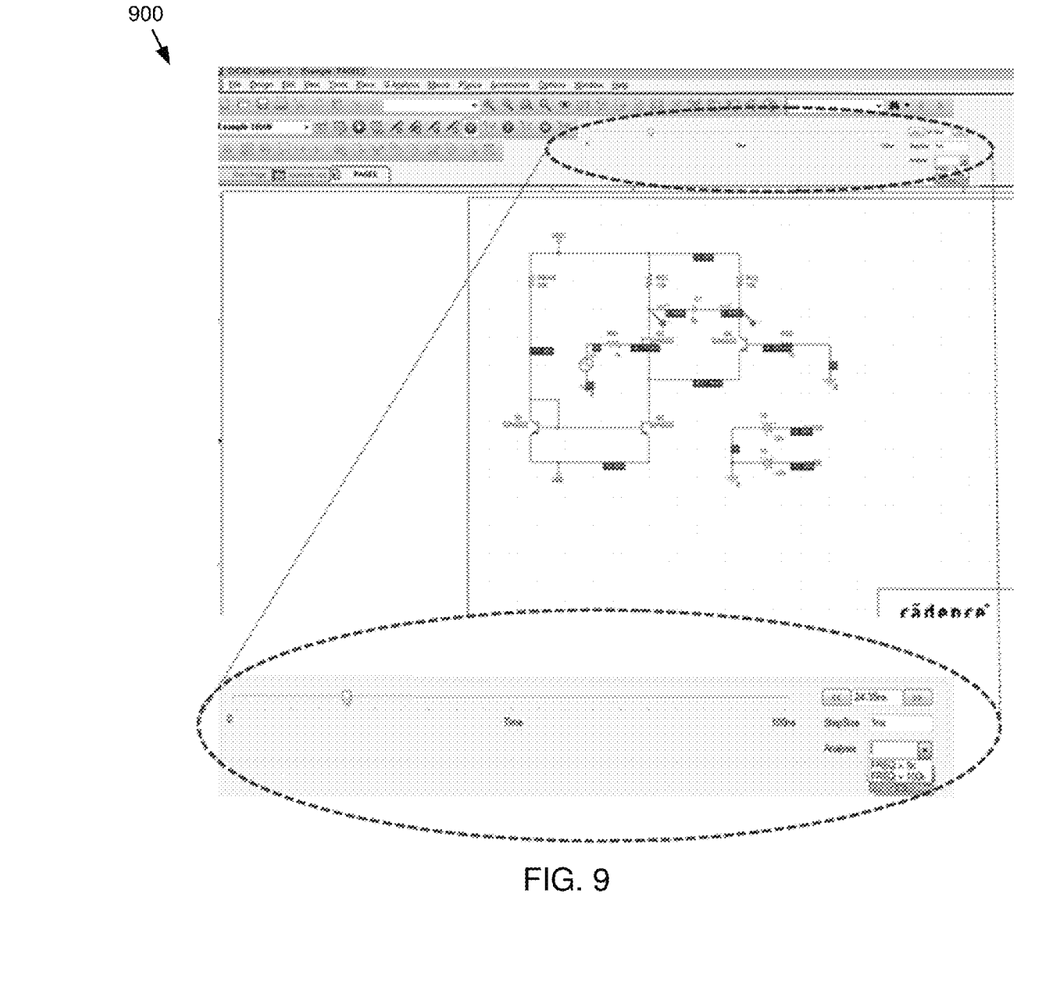
FIG. 9 is a diagram depicting an embodiment in accordance with the present disclosure.

Referring now to FIG. 9, an embodiment of visualization process 10 depicting an example of a parametric sweep where a transient analysis has been run multiple times with a parameter FREQ having values 1 k, 100 k and 10 Meg is provided. In this example, the FREQ value is selected in the slider to display results for the corresponding analysis.

In some embodiments, visualization process 10 may display data on the schematic using a number of formats. Some of these include, but are not limited to, schematic annotations, table view (e.g. used for displaying value for expressions), small graph-thumbnails annotated on the selected object for visualizing range of data selected on slider, neighborhood trends (e.g., the values could be shown with arrows, colors or icons displaying the positive or negative slope of values in its neighborhood). For example, a user may set up the system such that all increasing values are to be displayed in Red and Max/min values are to be underlined. These views may be driven by one or more sliders.

In some embodiments, visualization process 10 may provide designers with the ability to implement and use a number of debugging aids, including, but not limited to, jump to a specific simulation state, color-coding depending on user requirement (e.g. if a data value changes by a specific percentage), moving forward by slope of curve (e.g., Jump to next maxima, Jump to next minima, etc.), stability data (e.g., the system auto-detects when the data has stabilized within tolerances, and annotates the stabilized data values on the schematic), operating point (e.g. schematic is automatically annotated for TIME=0, thus showing operating point information on the schematic), worst-case (e.g. the system auto-finds max and min of a data set and displays both values), transfer function (e.g. the system auto-calculates V(output)/V(input) for a selected frequency, input/output impedances and a predefined input. Additionally and/or alternatively, a user-defined function can be used for displaying any context-sensitive function using the simulation-data. In some embodiments, the user may enter complex search rules to mark the key positions on the data, for example, "Mark all points where a particular transistor is going into saturation". The user interface then allows the user to jump to these states of data.

Figure 10:
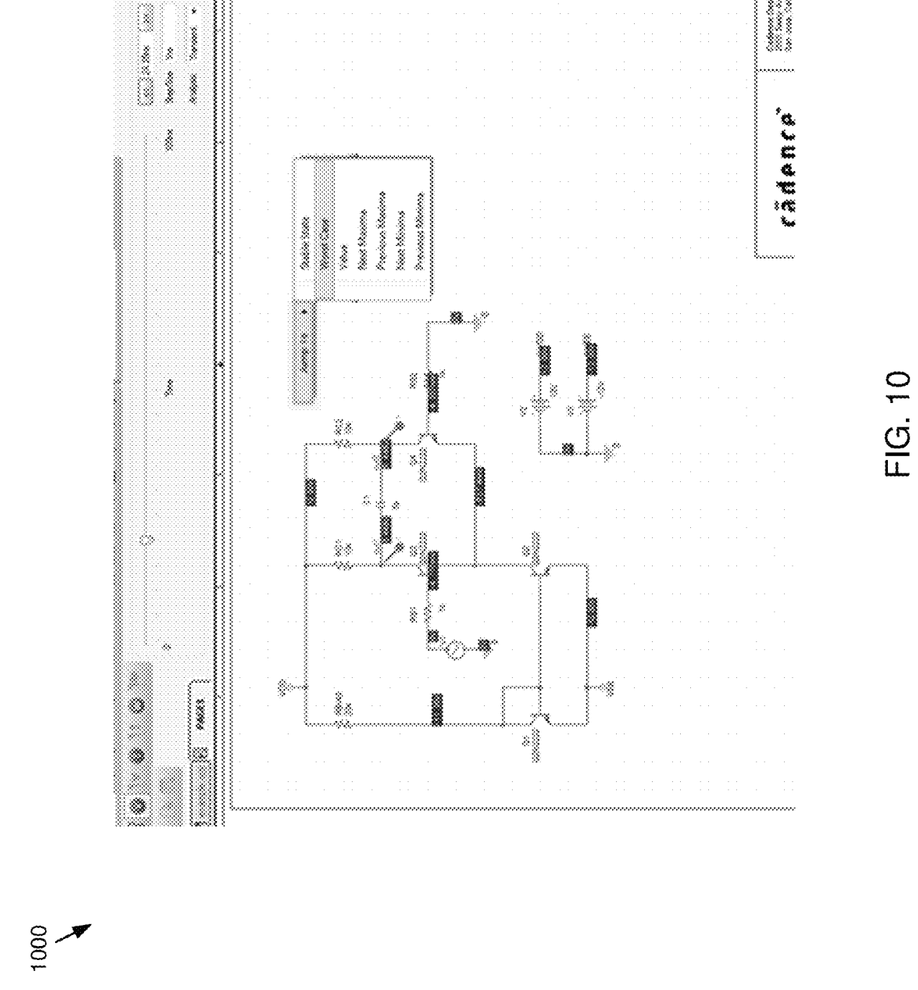
FIG. 10 is a diagram depicting an embodiment in accordance with the present disclosure.

Referring now to FIG. 10, an embodiment of visualization process 10 depicting debugging aids is provided. In this example, The "Jump To" context-sensitive menu can be used to jump to a Stable State, Worst-case, or to a specific value, and also to jump to Next or Previous Minima/Maxima for a specific data object.

Additionally and/or alternatively, visualization process 10 may be configured to debug convergence and accuracy issues in SPICE simulations. Existing solutions provide text reports on convergence issues with no insight into inner iterations of a simulator. However, as the design is exposed to only non-linear step, it becomes difficult to identify device modeling issues that are causing convergence problems or wrong results. Further, text reports are unable to show large quantities of data whereas simulation debug data is in Mega-bytes or Giga-bytes.

Figure 11:
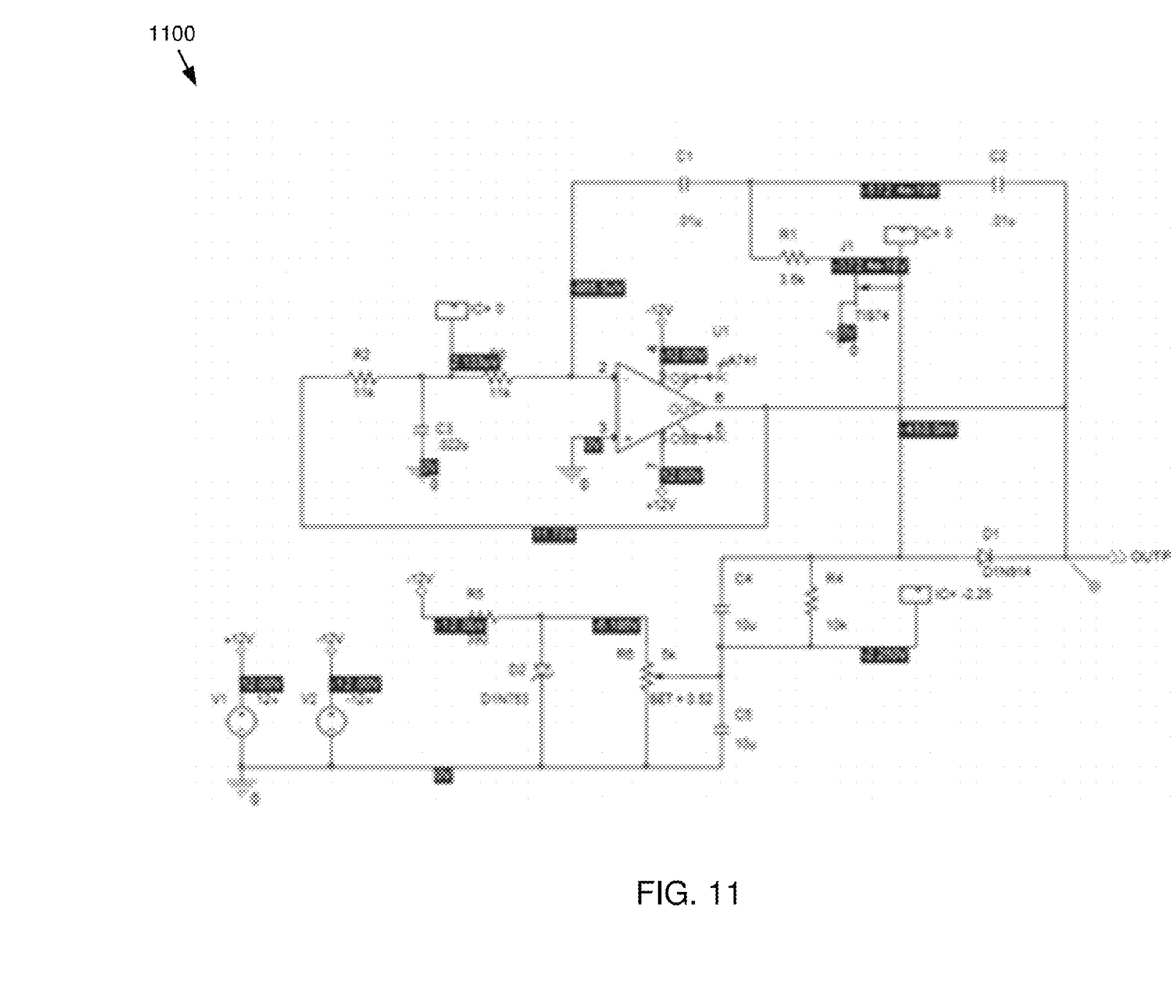
FIG. 11 is a diagram depicting an embodiment in accordance with the present disclosure.
Figure 12:
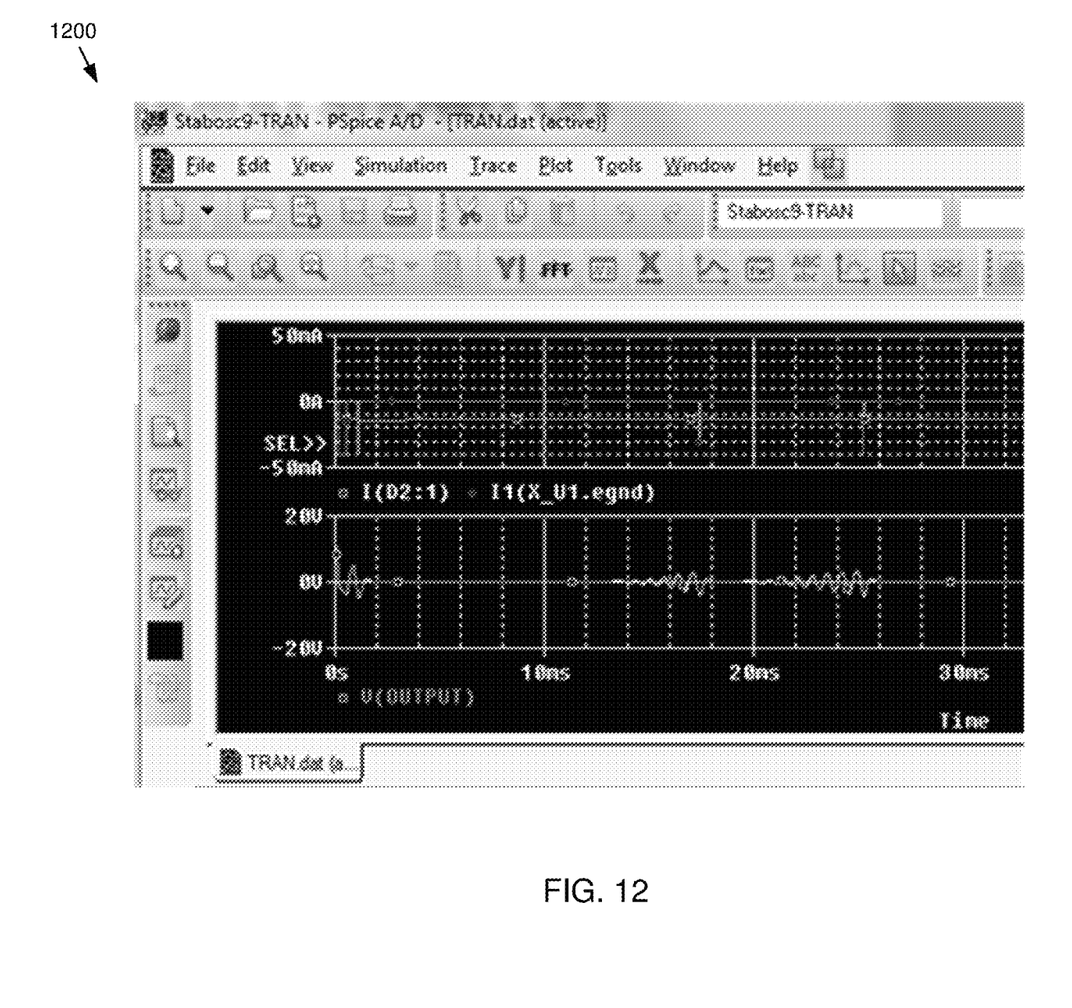
FIG. 12 is a diagram depicting an embodiment in accordance with the present disclosure.

Referring to FIGS. 11-12, visualization process 10 may be configured to expose inner simulation data to allow designers to observe the states of the simulation. This allows designers debug modeling issues more easily. In some embodiments, debug data may be available on plots as well as schematic annotations allowing large quantity of data to be analyzed. FIG. 11 shows an example displaying convergence failure data annotated on the schematic. FIG. 12 shows an example displaying debug data from simulations that are also available.

As discussed above, some solutions provide updates/animations on Schematics as the simulation is in progress. However, there is no solution available that can be used to debug with all kinds of simulation data on schematics. Some tools also provide annotation of transient data for a specific time point on the schematic. However, this functionality is limited in scope—it does not read other kinds of varying simulation output data, e.g. for parametric sweeps/ac analysis. Also, the selection of time point from a form is cumbersome, and involves multiple clicks any time the user wants to change the time-point under observation. Some tools also provide advanced means to enable annotation of varying data like ac sweep outputs. However such means are not automatic, and require the user to specify the points where the data needs to be annotated, and create complex visualization objects for the same. There is no existing art where parameter-dependent variable simulation data gets automatically annotated to schematics. E.g. temperature-dependent dc sweep output.

In some embodiments, visualization process 10 may provide annotation and plotting of simulation Debug data to assist in locating issues during design and simulation. One example may include, but is not limited to, showing inner interations of Spice convergence data to highlight modeling issues. Another example may include highlighting devices that are failing convergence and showing specific internal simulation data to show the details of convergence failure.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for electronic design simulation comprising:
   receiving, using at least one processor, an electronic design;
   displaying, at a graphical user interface, at least a portion of the electronic design;
   allowing a user to select at least one design variable at the graphical user interface;
   simulating the electronic design, based upon, at least in part, the selected at least one design variable;
   in response to the simulation, automatically displaying an updated value at the graphical user interface; and
   automatically annotating at least one device state associated with the electronic design at the graphical user interface, wherein automatically annotating at least one device state includes updating a bias status of a diode on a schematic associated with the electronic design.

2. The computer-implemented method of claim 1, wherein the at least one design variable includes a sweeping variable configured to generate continuously-varying simulation data.

3. The computer-implemented method of claim 2, wherein the sweeping variable includes at least one of time, frequency, resistance, temperature, and tolerance.

4. The computer-implemented method of claim 1, further comprising:
providing at least one slider at the graphical user interface, the at least one slider configured to allow the user to select the at least one design variable.

5. The computer-implemented method of claim 1, wherein the updated value includes at least one of a node voltage, a current through a pin, an amount of power consumption by a device, a change in current through a pin, a change in voltage across a net, an impedance across two terminals, a single variable expression, a differential variable expression, and a complex expression having two or more variables.

6. A computer-readable storage medium for electronic design simulation, the computer-readable storage medium having stored thereon instructions that when executed by a machine result in one or more operations, the operations comprising:
receiving, using at least one processor, an electronic design;
displaying, at a graphical user interface, at least a portion of the electronic design;
allowing a user to select at least one design variable at the graphical user interface;
simulating the electronic design, based upon, at least in part, the selected at least one design variable;
in response to the simulation, displaying an updated value at the graphical user interface; and
annotating at least one device state associated with the electronic design at the graphical user interface, wherein annotating at least one device state includes updating a saturation status of a transistor on a schematic associated with the electronic design.

7. The computer-readable storage medium of claim 6, wherein the at least one design variable includes a sweeping variable configured to generate continuously-varying simulation data.

8. The computer-readable storage medium of claim 7, wherein the sweeping variable includes at least one of time, frequency, resistance, temperature, and tolerance.

9. The computer-implemented method of claim 1, further comprising:
providing at least one slider at the graphical user interface, the at least one slider configured to allow the user to select the at least one design variable.

10. The computer-readable storage medium of claim 6, wherein the updated value includes at least one of a node voltage, a current through a pin, an amount of power consumption by a device, a change in current through a pin, a change in voltage across a net, an impedance across two terminals, a single variable expression, a differential variable expression, and a complex expression having two or more variables.

11. A system for electronic design simulation comprising:
one or more processors configured to receive an electronic design and display, at a graphical user interface, at least a portion of the electronic design, the one or more processors further configured to allow a user to select at least one design variable at the graphical user interface, the one or more processors further configured to simulate the electronic design, based upon, at least in part, the selected at least one design variable and in response to the simulation, the one or more processors configured to automatically display an updated value at the graphical user interface, the one or more processors further configured to automatically annotate at least one device state associated with the electronic design at the graphical user interface, wherein automatically annotating at least one device state includes updating a bias status of a diode on a schematic associated with the electronic design.

12. The system of claim 11, wherein the at least one design variable includes a sweeping variable configured to generate continuously-varying simulation data.

13. The system of claim 12, wherein the sweeping variable includes at least one of time, frequency, resistance, temperature, and tolerance.

14. The system of claim 11, wherein the one or more processors are further configured to provide at least one slider at the graphical user interface, the at least one slider configured to allow the user to select the at least one design variable.

* * * * *